United States Patent [19]
Tiemann

[11] Patent Number: 5,828,282
[45] Date of Patent: Oct. 27, 1998

[54] APPARATUS AND METHOD FOR SHIELDING A TOROIDAL CURRENT SENSOR

[75] Inventor: Jerome Johnson Tiemann, Schenectady, N.Y.

[73] Assignee: General Electric Company, Schenectady, N.Y.

[21] Appl. No.: 764,187

[22] Filed: Dec. 13, 1996

[51] Int. Cl.⁶ .............................. H01F 27/36; H01F 38/20; H01F 27/28
[52] U.S. Cl. ...................... 336/84 R; 336/229; 336/174; 336/83
[58] Field of Search ..................... 336/229, 182, 336/84, 177, 174, 175, 82, 83

[56] References Cited

U.S. PATENT DOCUMENTS

| | | | |
|---|---|---|---|
| 3,996,510 | 12/1976 | Guichard | 336/84 R |
| 4,611,191 | 9/1986 | Souchere | 336/229 |
| 4,623,865 | 11/1986 | Kissel et al. | 336/229 |
| 5,066,904 | 11/1991 | Bullock | 336/82 |

FOREIGN PATENT DOCUMENTS 55-71007 A   5/1980   Japan ...................... 336/83

*Primary Examiner*—Michael L. Gellner
*Assistant Examiner*—Anh Mai
*Attorney, Agent, or Firm*—Marvin Snyder; Douglas E. Stoner

[57] ABSTRACT

A toroidal current transformer magnetic shield includes, in one form, a cup portion and a cap portion. Both the cup and the cap are C-shaped, and when the cap is placed over the cup, the cup and cap define a toroidal sensor chamber. The cup portion and the cap portion are constructed of magnetically permeable material, such as iron or steel. A toroidal current transformer is positioned within the sensor chamber, so that the cap and cup enclose, and magnetically shield, the toroidal current transformer.

6 Claims, 3 Drawing Sheets

5,828,282

APPARATUS AND METHOD FOR SHIELDING A TOROIDAL CURRENT SENSOR

FIELD OF THE INVENTION

This invention relates generally to current sensors and more particularly, to shielding toroidal current sensors.

BACKGROUND OF THE INVENTION

Many electrical and electronic devices include current sensors for sensing current in a conductor. For example, in at least one known electricity meter, a current sensor is provided to sense current in a line conductor. More specifically, the line conductor carries an input current, $I_{in}$. A current divider divides the input current $I_{in}$ into two currents, $I_1$ and $I_2$, which are carried through resistors $R_1$ and $R_2$, respectively. A current comparator senses current $I_2$ and provides a scaled output current $I_{out}$ having a magnitude proportional, but many magnitudes lower than, input current $I_{in}$.

A known current comparator includes a current transformer having a core of magnetic material and first and second secondary windings. Each winding has a large number of turns of fine gage wire evenly distributed around the core. The core encircles the resistor carrying current $I_2$.

In operation, an alternating magnetic flux from the resistor carrying current $I_2$ is induced in the current comparator core, inducing a voltage in the secondary windings of the comparator. The signal from the secondary windings is provided to a high gain differential amplifier. The amplifier output signal is supplied to a feedback winding, and the feedback winding current is the scaled output current, $I_{out}$.

The above described current sensor is sometimes referred to in the art as a toroidal current sensor. In particular, the current comparator core is toroidally shaped and the secondary windings are toroidal windings. Although this known sensor provides acceptable results, it would be desirable to improve the sensing accuracy of the sensor.

More specifically, the current carrying conductors in a meter have associated magnetic fields. Interaction of the currents and magnetic fields results in inductances which may adversely affect the current sensor. Attempts to shield the core and secondary windings have been made, including the use of magnetic shields to protect toroidal sensors from magnetic fields. Specifically, in one known configuration, a metal plate is mounted near the sensor core. Although the plate effectively blocks some portion of the unwanted fields, at least another portion of the fields does affect the core. In another known configuration, the toroidal current sensor is mounted within a plastic molding, and a portion of the plastic immediately surrounding the sensor core has a conductive, or metallic, coating that serves as a magnetic shield. In this configuration too, however, some unblocked portion of the fields affects the core.

Although improving the shielding provided by known magnetic shields is desirable, such improved shielding preferably should not increase the cost of the current sensor nor its weight. It would be desirable to provide a more effective magnetic shield for toroidal current sensors, one which is less expensive and lighter than known shields.

SUMMARY OF THE INVENTION

The foregoing desiderata may be attained by a multi-part magnetic shield which, in one embodiment, includes a cup portion and a cap portion. Both the cup and cap portions are C-shaped, and when the cap portion is placed over the cup portion, the cup and cap portions define a toroidal sensor chamber. The cup and cap portions, sometimes referred to herein as the cup and the cap, respectively, are constructed of magnetically permeable material, such as iron or steel. A toroidal current transformer is positioned within the sensor chamber so that the cap and cup enclose the toroidal current transformer, providing a continuous, low reluctance path about the transformer that provides magnetic shielding therefor.

The multi-part shield, as described above, is situated very close to the toroidal current transformer and is believed to be more effective than known metal plates or plastic moldings with respect to shielding the toroidal current transformer. Moreover, when situated very close to the toroidal transformer, the cup and cap may be constructed from very thin sheets of metal, and therefore, the shield is believed to be less expensive and lighter than known shields.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE DRAWINGS

Figure 1:
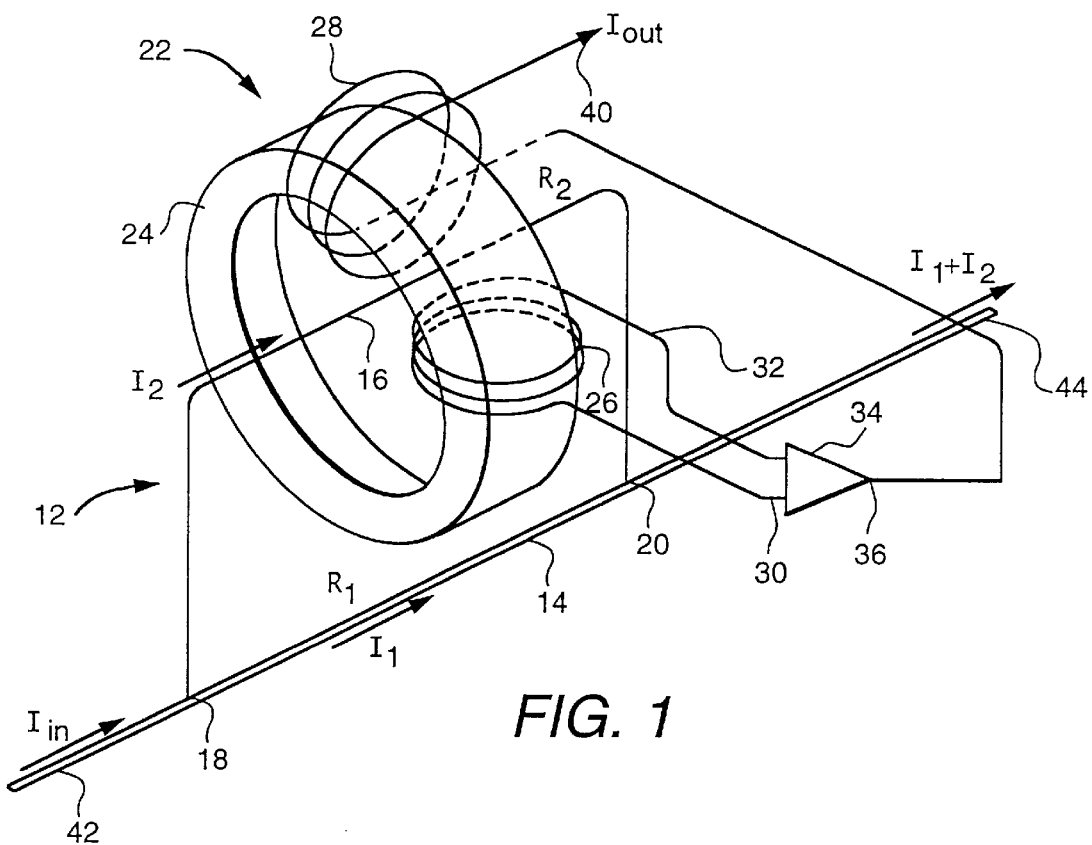
FIG. 1 is a simplified schematic diagram of a current sensor.

FIG. 1 is a simplified schematic diagram of a known current sensor 10 which includes a current divider, shown generally at 12. Divider 12 includes a first current-carrying element, shown as a shunt resistor 14 having an ohmic value $R_1$, and a second current-carrying element, shown as a measuring resistor 16 having an ohmic value $R_2$. As shown in FIG. 1, resistors 14 and 16 are connected in parallel through nodes 18 and 20.

Sensor 10 also includes a current comparator 22, shown as a toroidal current transformer which includes a core 24 of magnetic material and first and second secondary windings 26 and 28, respectively. Windings 26 and 28 are each made up of a large number N of turns of fine gage wire evenly distributed around core 24. Core 24 encircles resistor 16, and resistor 16 serves as a single turn primary winding for current comparator 22.

The current $I_{in}$ to be measured divides into a current $I_1$ in shunt resistor 14 and a current $I_2$ in measuring resistor 16. Current $I_2$ provides a first stage of scaling of the input current $I_{in}$ and is given by:

$$I_2 = \frac{I_{in}}{K}, \qquad (1)$$

-continued $$\text{where } K = \frac{R_2}{R_1} + 1.$$

Current comparator 22 provides a second stage of scaling of input current $I_{in}$ by sensing current $I_2$ in resistor 16 and providing a fully scaled output current or signal $I_{out}$ having a magnitude proportional to input current $I_{in}$, but many magnitudes lower than $I_{in}$.

The operating principles of toroidal current transformer 22 are relatively straightforward and well known in the art. It is well known, for example, that an alternating magnetic flux field surrounds any current-carrying conductor when an alternating current is passed through the conductor. In toroidal current transformer 22, an alternating magnetic flux from resistor 16 is induced in core 24. Secondary winding 26 on core 24 is used to sense the presence of this alternating flux in core 24. This sensing results in a voltage being induced in winding 26 to provide an input signal, via conductors 30 and 32, to negative (−) and positive (+) input terminals of a high gain differential amplifier 34.

An output terminal 36 of amplifier 34 is coupled to one end of compensation or feedback winding 28. The output signal from amplifier 34 causes an output current $I_{out}$ in winding 28 to flow to an output terminal 40. The current direction in winding 28 is such as to induce a compensating flux from winding 28 that passes through core 24 to reduce the alternating flux in the core toward zero. Toroidal current transformer 22 and amplifier 34 operate dynamically to keep the alternating magnetic flux in core 24 at a low value approaching zero. As a result, the magnetizing ampere turns resulting from the measured or sensed current $I_2$ in the single turn primary winding (formed by resistor 16) of core 24 are balanced by the magnetizing ampere turns resulting from current $I_{out}$ flowing in the N turn secondary winding 28. Since the transformer ampere turns are equal, or balanced, then:

$$N * I_{out} = I_2 * 1 \quad (2a)$$

$$I_{out} = \frac{I_2}{N} \quad (2b)$$

Substituting from Equation (1) yields:

$$I_{out} = \frac{I_{in}}{K * N}. \quad (3)$$

The output signal $I_{out}$ of current sensor 10 is a scaled version of the input alternating current $I_{in}$ where the final scaling factor is the product of two independent scale factors determined by a ratio of resistances (K) and the number of turns N in secondary winding 28. Also, current sensor 10 is configured to be connected so that input current $I_{in}$ is supplied by a line conductor 42 and total current $I_1+I_2$ flows out of sensor 10 in a conductor 44 to a load, e.g., a residence or industrial site.

Interaction between current in any current carrying conductor, including resistors 14 and 16, and their associated magnetic fields, results in self and mutual inductances which change simple resistors into more complex impedances when current sensor 10 is used to measure alternating (AC) currents. To best ensure accurate sensing of current $I_2$, core 24 is preferably shielded from magnetic fields that could adversely affect accuracy.

Figure 2:
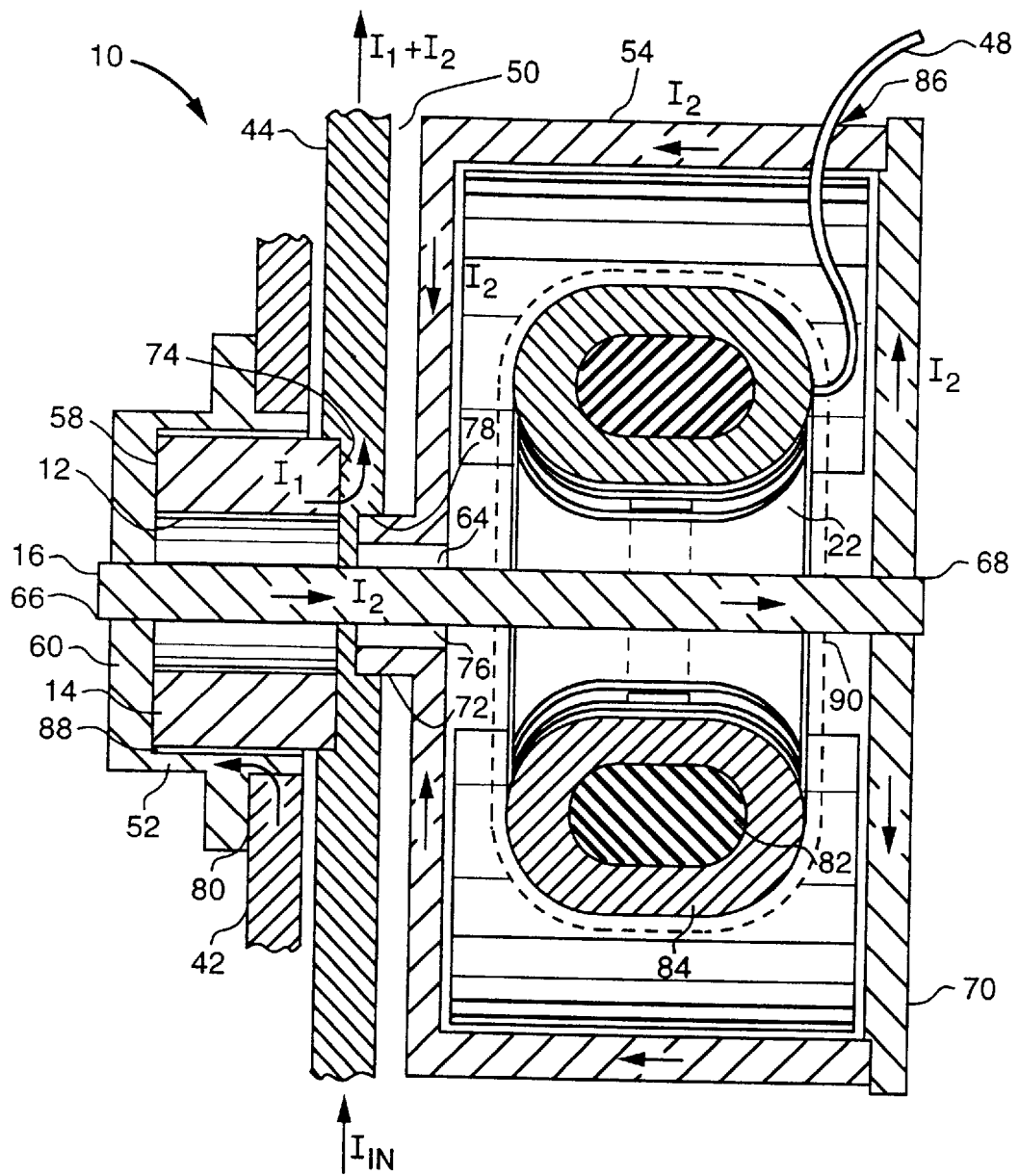
FIG. 2 is a cross-sectional view of a current sensor implementing the electrical connections illustrated schematically in FIG. 1.

In FIG. 2, current divider 12 of sensor 10, in accordance with one embodiment of the invention, is shown constructed of a cylindrical conductive housing, shown generally at 50, comprising two cylindrical cup shaped conductive members 52 and 54 which are joined together to form the housing. Conductor 42 may form an integral part of member 52 and conductor 44 may form an integral part of member 54. In accordance with one embodiment, conductive housing 50, including members 52 and 54 and conductors 42 and 44, are comprised copper.

Shunt resistor 14 is of cylindrical construction and includes an aperture 56 extending lengthwise therethrough. Resistor 14 is of a larger cross-section than resistor 16 and thus is of much lower resistance than resistor 16. Resistor 14 is mounted within member 52 and is electrically isolated therefrom, except at its point of circumferential attachment of a first end 58 to a face or bottom 60 of cup-shaped member 52. The other end 62 of resistor 14 is similarly attached to the open end of member 54.

Measuring resistor 16 is shown as an elongated cylindrical rod disposed within aperture 56 of resistor 14 and the hollow portion of member 54. Member 54, at its open end, has a neck 72 containing an aperture 64 for receiving resistor 16. Resistor 16 is electrically connected, through bonds at locations 66 and 68, to bottom 60 of member 52 and to a face or bottom 70 of member 54. Except for these points of connection, resistor 16 is electrically isolated from the rest of current divider 12.

In accordance with the embodiment of FIG. 2, conductor 44 has a clearance hole 76 through which resistor 16 passes. As shown, conductor 44 is attached on opposite faces thereof at 78 and 62 to member 54 and shunt resistor 14, thus, bonding shunt resistor 14, measurement resistor 16 and member 54 into a current divider of unitary construction.

The interconnection of member 52 and bonded conductor 42 is also shown in FIG. 2. Specifically, in the embodiment shown, conductor 42 is bonded at the circumference of member 52 as shown by a conductive connection made at a shoulder 80 on member 52.

Current comparator 22 is mounted within member 54 and is electromagnetically coupled to resistor 16 to provide an output signal $I_{out}$ proportional to the input current, $I_{in}$. In one embodiment, comparator 16 is a transformer comprised of a toroidal magnetic core 82 and is disposed around resistor 16. Resistor 16 serves as a single turn primary winding for the transformer. Toroidal secondary windings 84 (windings 26 and 28 of FIG. 1) are wound on core 82. Terminations (input and output connections) from windings 48 are brought out through an opening 86 in member 54, as shown, for connection to an external amplifier, such as amplifier 34 shown in FIG. 1.

In one embodiment, all the current carrying components of current sensor 10 are of coaxial construction. As shown in FIG. 2, cup-shaped member 52 includes an inner wall 88 that is circumferentially disposed coaxially around resistor 14 and extends over a portion of resistor 16 to a point 74 adjacent conductor 44.

The above coaxial relationship of the current carrying components are maintained throughout sensor 10 by the coaxial relationship of measurement resistor 16 and member 54, which are mounted coaxially with respect to each other, as well as by the coaxial relationship of member 52 and resistor 14. Further, it will be appreciated that transformer core 82 of comparator 22 is also coaxial with the other component parts of the sensor by being coaxially disposed around resistor 16.

In accordance with the embodiment of the invention shown in FIG. 2, a magnetic shield 90 at least partially surrounds toroid core 82. Magnetic shield 90 comprises magnetically permeable material, such as iron or steel, positioned in as close proximity to core 82 as possible without making electrical contact with windings 84.

Figure 3:
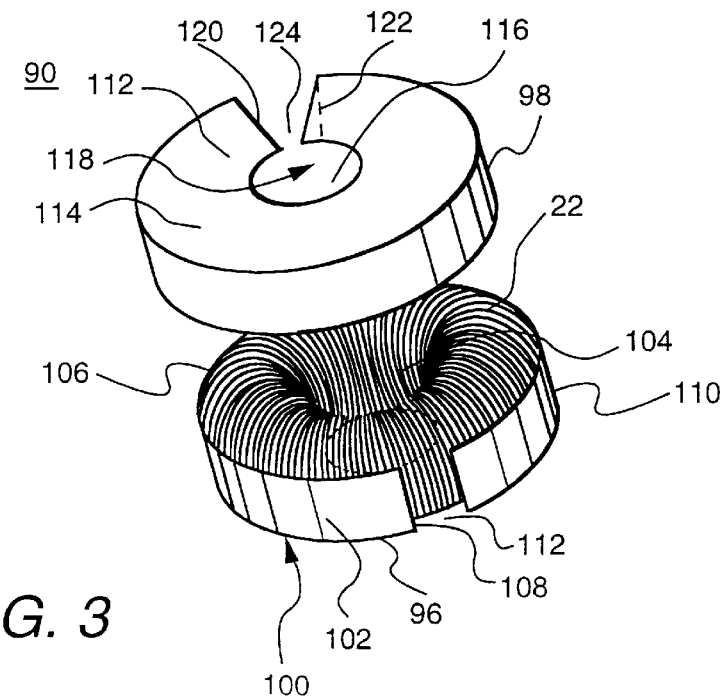
FIG. 3 is a perspective view of a toroidal current transformer and a shield constructed in accordance with one embodiment of the present invention.

As shown in FIG. 3, magnetic shield 90 is comprised of a first portion 96 and a second portion 98. First portion 96 is a shield cup portion and second portion 98 is a shield cap portion. Shield cup portion 96 and shield cap portion 98 are constructed of magnetically permeable material, such as thin sheets of iron or some other metal.

Shield cup portion 96 has a retaining surface 100, a sidewall surface 102, and a resistor aperture 104 through which resistor 16 (FIG. 2) may extend. Sidewall surface 102 extends generally perpendicularly from retaining surface 100 to form a chamber portion 106. Toroidal current transformer 22 has an outer diameter less than the inner diameter of chamber portion 106. Sidewall surface 102 is preferably partially circumferential, having a first end 108 and a second end 110, with a gap 112 between ends 108 and 110. Shield cup portion 96 therefore is "C" shaped.

Shield cap portion 98 has a retaining surface 112 and a sidewall surface 114. Shield cap portion 98 also has a resistor aperture 116 through which resistor 16 (FIG. 2) may extend. Sidewall surface 114 extends generally perpendicularly from retaining surface 112 to form a chamber portion 118. Toroidal current transformer 22 has an outer diameter less than the inner diameter of chamber portion 118. Sidewall surface 114 is preferably circumferential, having a first end 120 and a second end 122, with a gap 124 between ends 120 and 122. Shield cap portion 98 therefore is "C" shaped.

Figure 4:
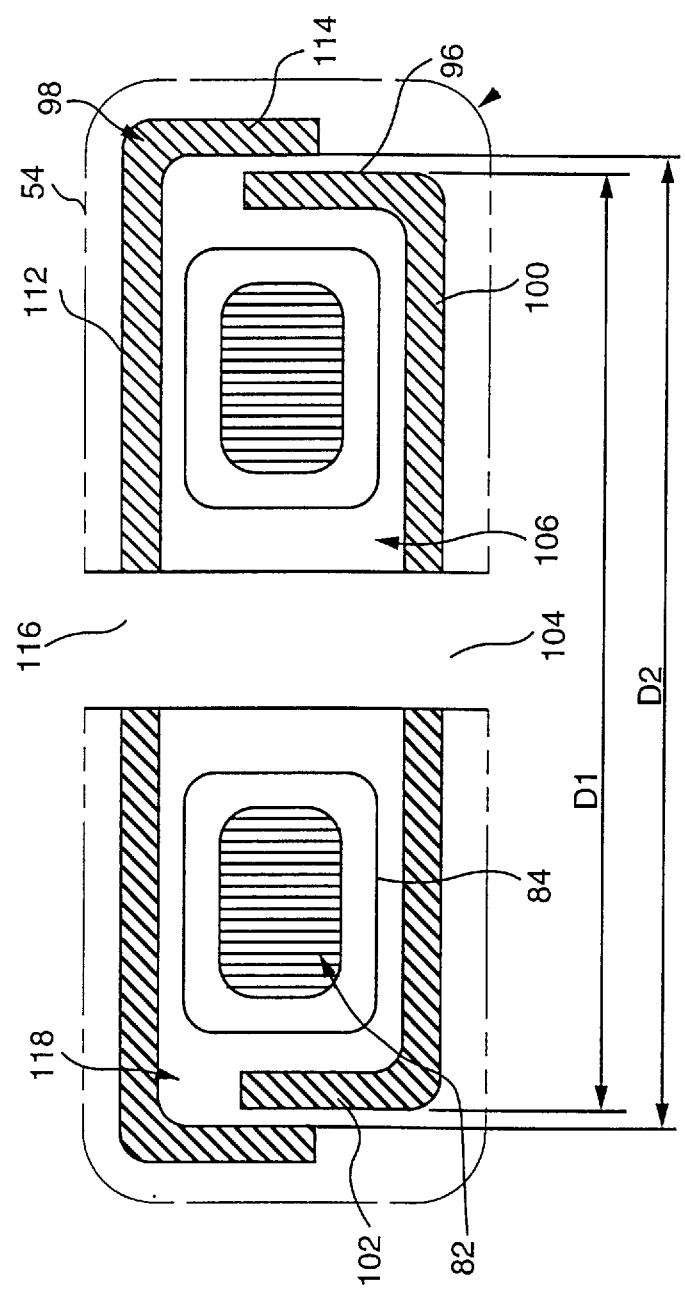
FIG. 4 is a sectioned view of the toroidal current transformer and shield shown in FIG. 3.

As shown in FIG. 4, shield cup portion 96 and shield cap portion 98 cooperate so that core 82 can be located between retaining surface 100 and retaining surface 112. Specifically, shield cup retaining surface 100 is oriented parallel to shield cap retaining surface 112. Sidewall surface 102 is both parallel and adjacent to sidewall surface 114, and shield cup sidewall surface 102 has an outer diameter D1 and shield cap sidewall surface 114 has an inner diameter D2. Outer diameter D1 is smaller than inner diameter D2, permitting sidewall surface 114 to at least partially circumscribe sidewall surface 102. Shield cup portion 96 and shield cap portion 98 also are coaxial so that cup resistor aperture 104 is aligned with cap resistor aperture 116.

While only certain preferred features of the invention have been shown and described, many modifications and changes will occur to those skilled in the art. For example, the shield cup sidewall is described herein as extending generally perpendicularly from the retaining surface; however, the shield cup sidewall may extend at other angles from the retaining surface; Furthermore, while the conductors are described as copper, other suitable conductive materials, such as aluminum, may be used. Moreover, while the embodiments of the shield are shown to be of cylindrical construction and shape, rectangular or other suitable shapes may be constructed. Accordingly, it is to be understood that the appended claims are intended to cover all such modifications and changes as fall within the true spirit of the invention.

What is claimed is:

1. A current sensor for sensing current supplied by a conductor thereto, said sensor comprising:

a toroidally shaped magnetic core having a conductor aperture therein;

secondary windings wound on said core; and a magnetically permeable shield comprising a C-shaped cup portion and a C-shaped cap portion, said cup portion and said cap portion together forming a chamber enclosing said magnetic core and said secondary windings wound on said magnetic core, each of said cup portion and cap portion having an aperture therein.

2. The current sensor of claim 1 further comprising a current divider for dividing current supplied thereto, said current divider including a first conductor, and a second conductor having first and second ends joined to said first conductor so as to provide electrical connection between said first and second conductors, said first conductor extending through said toroidal core conductor aperture and through said cup portion and cap portion aperture.

3. The current sensor of claim 2 wherein said cup portion comprises a first retaining surface having the cup portion aperture therein and a first sidewall surface extending from said first retaining surface, and said cap portion comprises a second retaining surface having the cap portion aperture therein and a second sidewall surface extending from said second retaining surface, said retaining surfaces and sidewall surfaces forming said chamber.

4. The current sensor of claim 3 wherein said cap portion aperture is substantially coaxially aligned with said cup portion aperture.

5. The current sensor of claim 3 wherein said second retaining surface is substantially parallel to said first retaining surface, said second sidewall surface is substantially parallel to said first sidewall surface, and said first sidewall surface is adjacent to said second sidewall surface.

6. The current sensor of claim 5 wherein said second sidewall surface is at least partially circumferential so as to have an inner diameter, said first sidewall surface is at least partially circumferential so as to have an outer diameter, said first sidewall surface outer diameter being smaller than said second sidewall surface inner diameter, and said cup portion is configured to cooperate with said cap portion so that said second sidewall at least partially circumscribes said first sidewall.

\* \* \* \* \*